United States Patent
Liao

(10) Patent No.: US 7,851,710 B2
(45) Date of Patent: Dec. 14, 2010

(54) WATERPROOF AND DUSTPROOF STRUCTURE

(75) Inventor: Shu Hsien Liao, Taipei (TW)

(73) Assignee: Twinhead International Corp., Taipei (TW)

( * ) Notice: Subject to any disclaimer, the term of this patent is extended or adjusted under 35 U.S.C. 154(b) by 277 days.

(21) Appl. No.: 11/849,607

(22) Filed: Sep. 4, 2007

(65) Prior Publication Data

US 2008/0055867 A1    Mar. 6, 2008

Related U.S. Application Data

(60) Provisional application No. 60/824,566, filed on Sep. 5, 2006.

(51) Int. Cl.
*H05K 5/06* (2006.01)
(52) U.S. Cl. ...................................... 174/564; 439/271
(58) Field of Classification Search ................ 174/520, 174/564; 361/752; 439/271
See application file for complete search history.

(56) References Cited

U.S. PATENT DOCUMENTS

| | | | |
|---|---|---|---|
| 7,108,519 B2* | 9/2006 | Tomikawa et al. | 439/76.2 |
| 7,109,426 B2* | 9/2006 | Togashi | 174/520 |
| 7,151,674 B2* | 12/2006 | Sasaki et al. | 361/752 |
| 2004/0089467 A1* | 5/2004 | Kubota | 174/67 |
| 2004/0188122 A1* | 9/2004 | Takeuchi et al. | 174/50 |
| 2005/0282433 A1* | 12/2005 | Pixley et al. | 439/578 |
| 2006/0003603 A1 | 1/2006 | Fukuchi | |
| 2006/0003606 A1* | 1/2006 | Wei-Chieh et al. | 439/65 |

FOREIGN PATENT DOCUMENTS

TW    487177    5/2002

OTHER PUBLICATIONS

Office Action dated Mar. 19, 2010 for 096121756, which is a corresponding Taiwanese application, that cites TW487177 and US2006/0003603A1.

* cited by examiner

*Primary Examiner*—Hung V Ngo
(74) *Attorney, Agent, or Firm*—WPAT, P.C.; Anthony King

(57) ABSTRACT

A waterproof and dustproof structure is applied to a predetermined hole of a circuit board. A connection end of a connector could penetrate the predetermined hole. Moreover, the circuit board has a first surface and a second surface. The waterproof and dustproof structure can cover up the predetermined hole to isolate the first surface and the second surface. The interferences on the first surface may not move to the second surface through the predetermined hole. Therefore, when the connection end of the connector passes through the predetermined hole, the predetermined hole on the circuit board can be sealed via the waterproof and dustproof structure so as to achieve the goal of waterproof and dust prevention.

12 Claims, 5 Drawing Sheets

WATERPROOF AND DUSTPROOF STRUCTURE

FIELD OF THE INVENTION

The present invention relates to a waterproof and dustproof structure, and more particularly to the structure that achieves the efficiency of waterproof and dust prevention by sealing a predetermined hole.

BACKGROUND OF THE INVENTION

As technology is advanced gradually, people may rely upon electronic devices more than before. To satisfy the demand of carrying the electronic devices, portable computers have been substituted for desktop computers gradually.

However, these electronic devices need to be connected with each other through wires. The motherboards of the electronic devices must have predetermined holes for installing the wires connected to the connector. Water and dust may permeate into the motherboard through the predetermined holes, resulting in damaging electronic elements of the motherboards. Waterproof and dustproof function for the motherboards is an important issue that needs to be overcome by research and development workers.

Referring to FIG. 1 for the exploded diagram illustrates a conventional waterproof and dustproof structure. A predetermined hole 111 is disposed on a circuit board 11 of an electronic device. A housing 12 of the electronic device has an opening 121 for inserting a connector. When the connector is not inserted into the opening 121, an external lid 13 is used to cover up the opening 121 to prevent dust or water from permeating into the circuit board 11 through the opening 121 and the predetermined hole 111.

Referring to FIG. 2 for the cross-sectional diagram illustrates the conventional connector inserted into the opening. The exterior lid 13 may not be used while inserting the connector 21, and the connector 21 may not be closely attached to the interior edge of the opening 121. Since a connection end 211 of the connector 21 passes through the predetermined hole 111, water and dust may permeate into the circuit board 11 along the connection end 211 of the connector 21, thereby damaging the electronic elements.

Therefore, the inventor of the present invention based on years of experience on related research and development invents a waterproof and dustproof structure to overcome the foregoing shortcomings.

SUMMARY OF THE INVENTION

Briefly, an objective of the present invention is to provide a waterproof and dustproof structure that is applied to a predetermined hole of a circuit board. The problem of easily permeating water and dust can be efficiently overcome by utilizing the waterproof and dustproof structure made of a tin solder, a metal or a plastic material to seal the predetermined hole.

To achieve the foregoing objective, the waterproof and dustproof structure of the present invention is utilized to the predetermined hole provided by the circuit board. When the circuit board is equipped with a connector, a connection end of the connector can pass through the predetermined hole. The circuit board has a first surface and a second surface. The waterproof and dustproof structure is at the second surface and provided for covering up the predetermined hole to isolate the first surface and the second surface of the circuit board, so that the interference at the first surface such as liquid or dust may not be moved to the second surface through the predetermined hole. The waterproof and dustproof structure includes an accommodating space to prevent the connection end of the connector from penetrating the waterproof and dustproof structure while passing through the predetermined hole.

Simultaneously, the waterproof and dustproof structure is made of a tin solder, a metal, a plastic material or other waterproof and dustproof material, and assembled to the second surface of the circuit board and provided for sealing the predetermined hole, thereby providing the efficiency of waterproof and dustproof. Moreover, the circuit board can be a motherboard that is disposed into a personal computer, a portable computer or a display monitor. Accordingly, the waterproof and dustproof structure can prevent liquid or dust from entering the aforesaid devices through the predetermined hole of the motherboard so as to isolate water and dust.

In accordance with the waterproof and dustproof structure provided by the present invention, the problem of efficiently sealing the predetermined hole through the conventional exterior housing can be exactly overcome. Further, the waterproof and dustproof structure of the present invention can improve the product's competition ability in the laptop computer industry.

Other features and advantages of the present invention and variations thereof will become apparent from the following description, drawings, and claims.

DETAILED DESCRIPTION OF THE PREFERRED EMBODIMENTS

Figure 1:
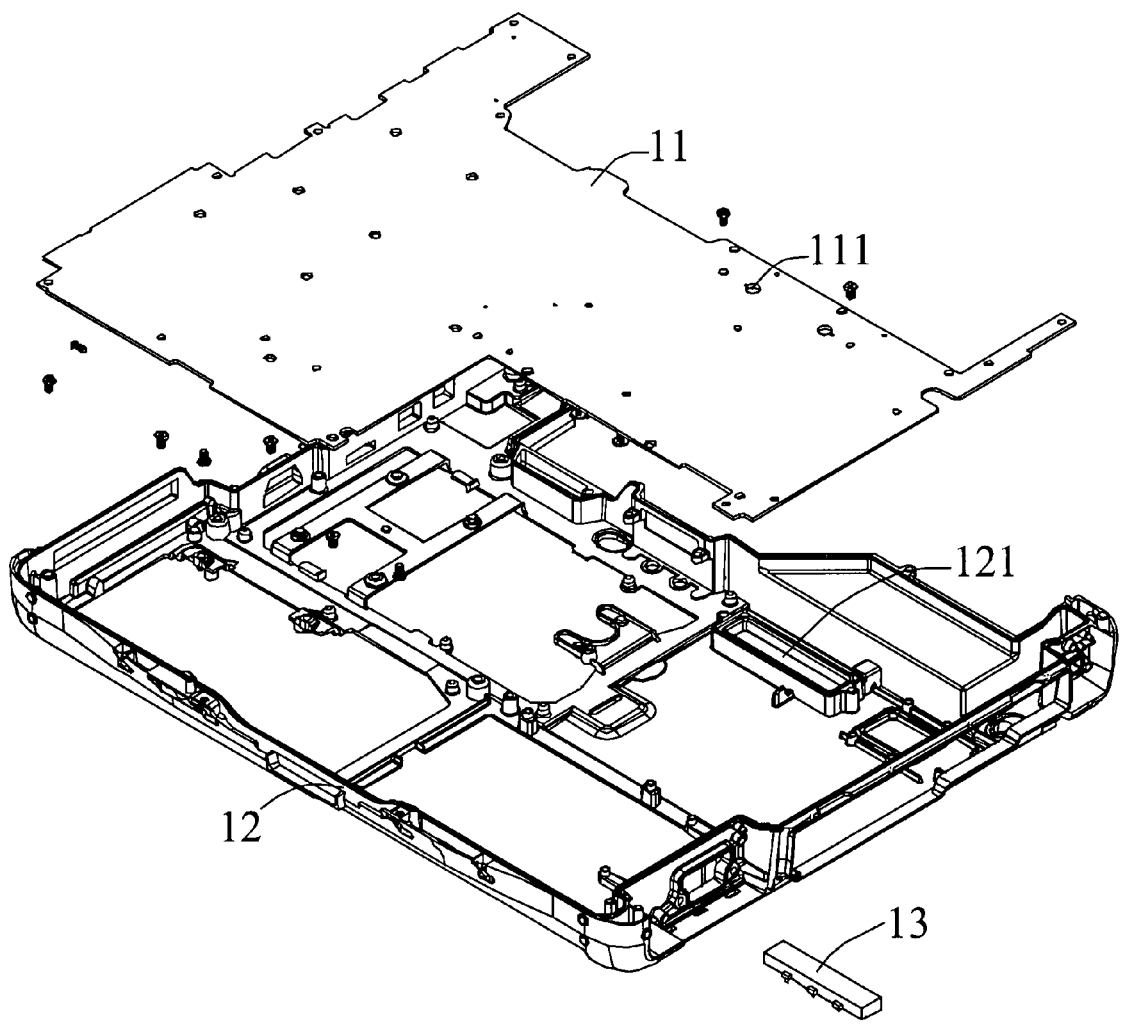
FIG. 1 is an exploded diagram illustrating a conventional waterproof and dustproof structure.
Figure 2:
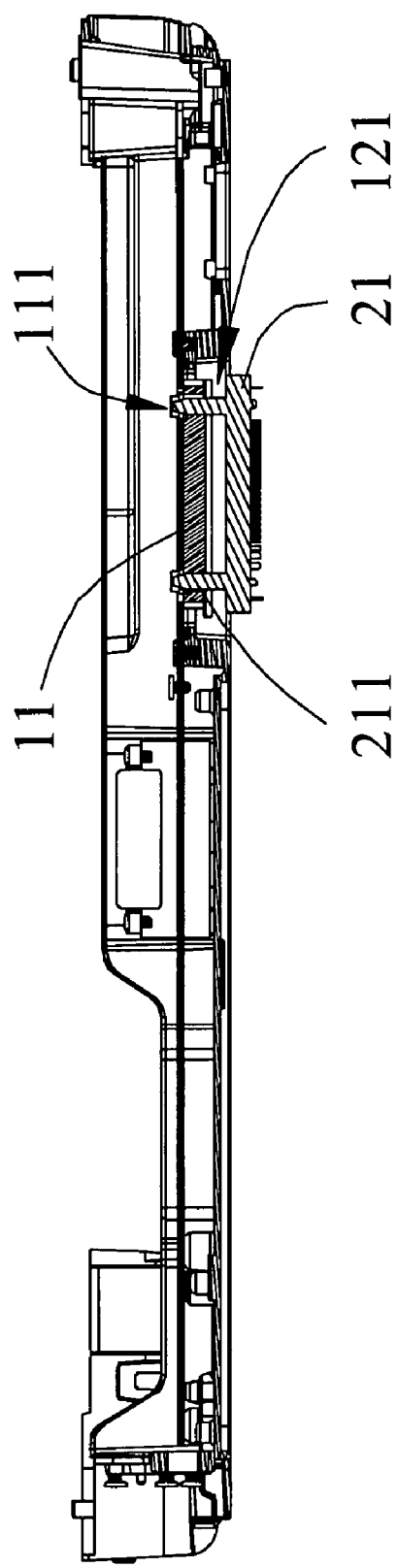
FIG. 2 is a cross-sectional drawing illustrating a conventional connector inserted into the opening.
Figure 3:
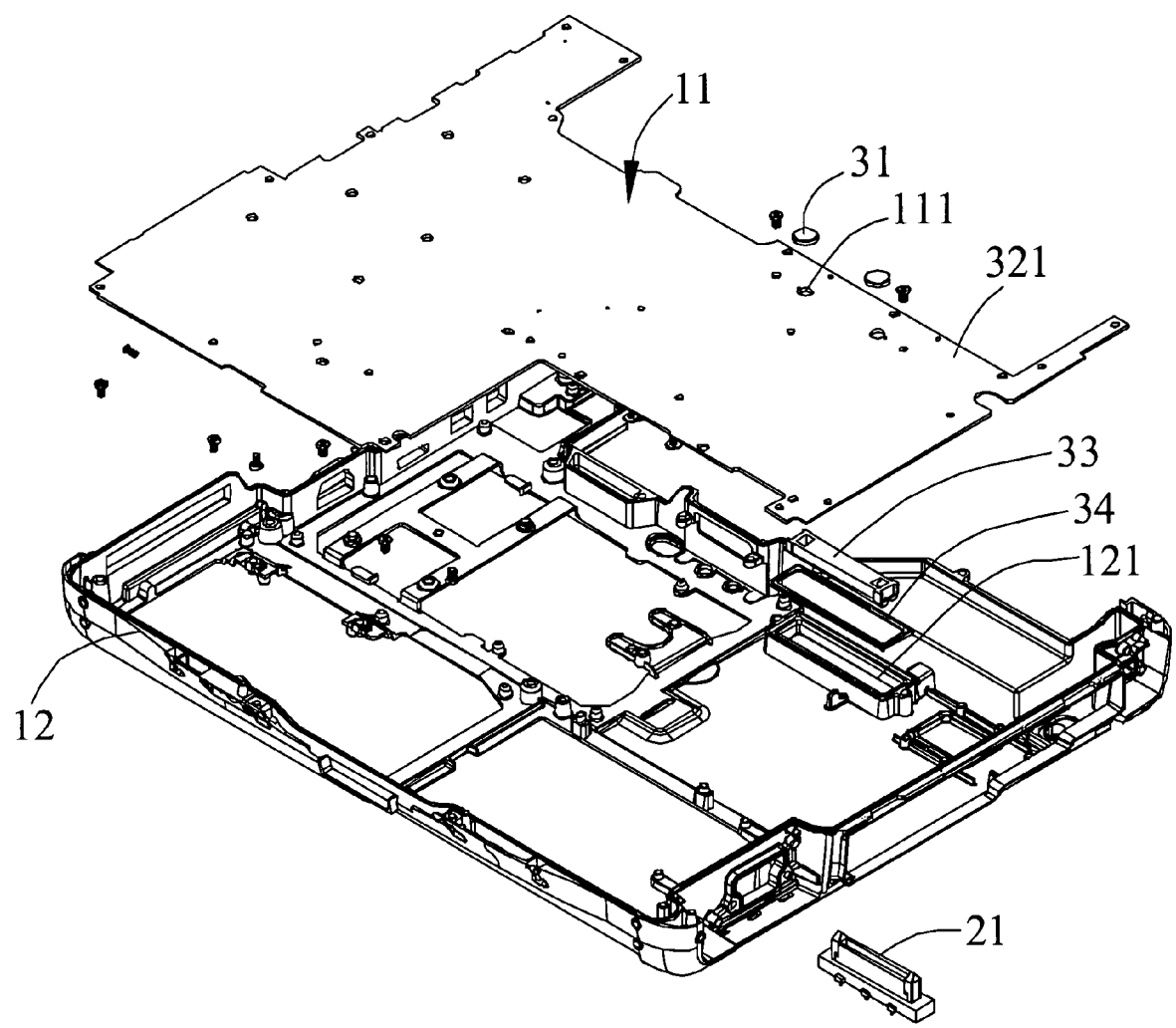
FIG. 3 is a schematic diagram illustrating a waterproof and dustproof structure according to a preferred embodiment of the present invention.

Referring to FIG. 3 for the schematic diagram illustrates a waterproof and dustproof structure according to a preferred embodiment of the present invention. The waterproof and dustproof structure 31 is disposed on a first surface 321 of the circuit board 11 to seal the predetermined hole 111 of the circuit board 11. The circuit board 11 is assembled into the housing 12 of the electronic device. The housing 12 has the opening 121 inserted by the connector 21. A female connector 33 corresponds to the position of the opening 121 of the housing 12, and the female connector 33 installed to the interior of the opening 121 is provided for connecting the connector 21. A waterproof rubber 34 is disposed between the female connector 33 and the opening 121 for fastening the female connector 33, and prevents the interferences between the female connector 33 and the opening 121 from infiltrating the housing 12 of the electronic device. The waterproof and dustproof structure 31 is made of a tin solder, a metal, a plastic material or other waterproof and dustproof material. By utilizing the aforesaid materials, the shape and the size of the waterproof and dustproof structure 31 can be changed according to the shape or the size of the predetermined hole 111 so as to reduce the manufacture cost. The circuit board 11 is preferably a motherboard that can be installed inside the personal computer, the laptop computer or the display monitor. The connector 21 is preferably a male connector. The interferences can be dust or liquid.

Figure 4:
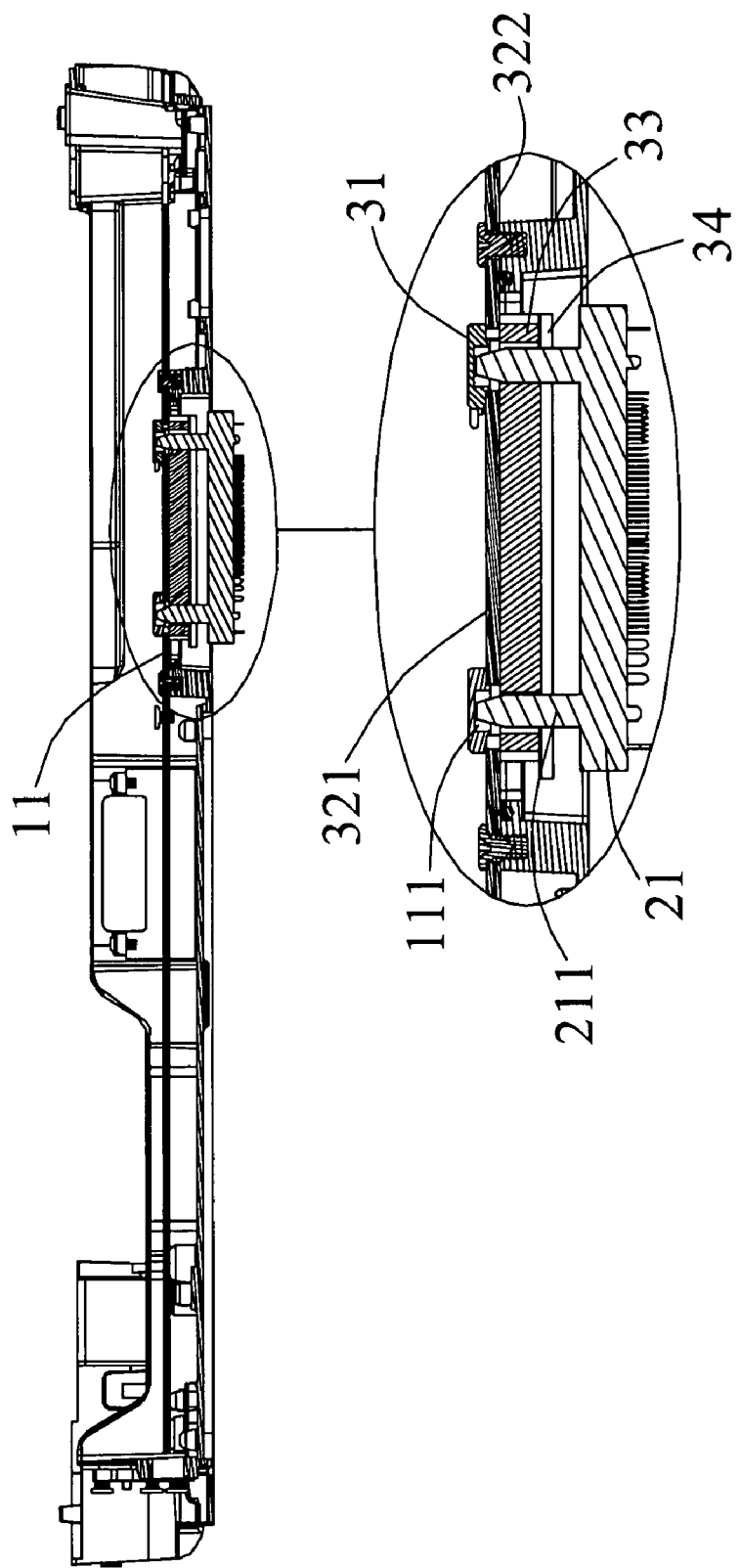
FIG. 4 is a cross-sectional drawing illustrating a waterproof and dustproof structure according to a preferred embodiment of the present invention.

Referring to FIG. 4 and FIG. 3, FIG. 4 is a cross-sectional drawing of a waterproof and dustproof structure according to a preferred embodiment of the present invention. The circuit board 11 has a first surface 321 and a second surface 322. The waterproof and dustproof structure 31 is closely assembled to the first surface 321 of the circuit board 11, and provided for sealing the predetermined hole 111 to isolate the first surface 321 and the second surface 322, so that the interferences may not move to the first surface 321 through the predetermined hole 11. Further, an accommodating space (not shown in the figure) is provided and taken as the depth of disposing the connection end 211 of the connector 21, and can prevent the connection end 211 of the connector 21 from penetrating the waterproof and dustproof structure 31 while passing through the predetermined hole 111. Moreover, the female connector 33 has a through hole (not shown in the figure) corresponding to the predetermined hole 111. The through hole is provided for connecting and fastening connector 21. Since the connector 21 is inserted and fastened, liquid and dust can be therefore isolated.

Figure 5:
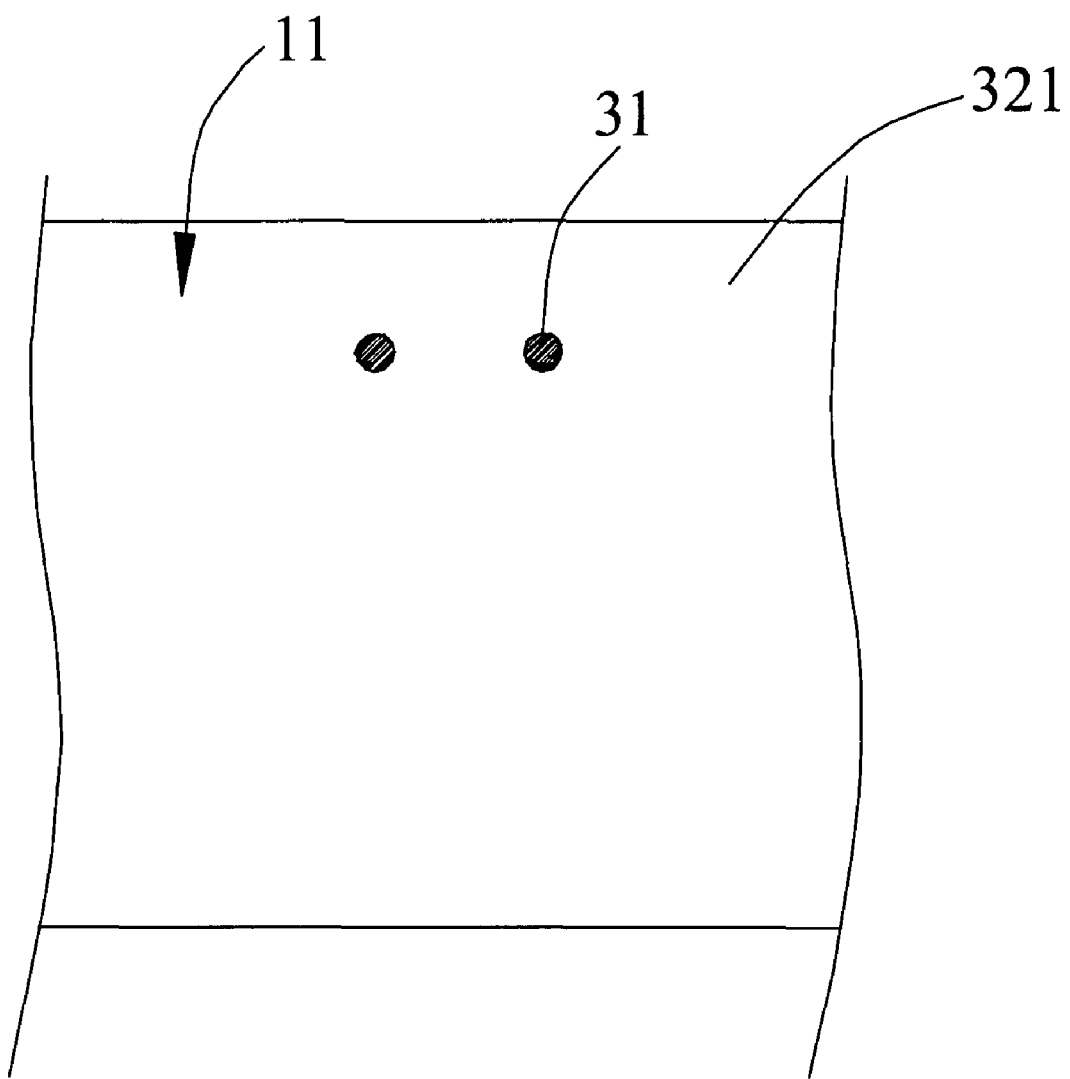
FIG. 5 is a vertical view illustrating a waterproof and dustproof structure of the present invention.

Referring to FIG. 5 for the vertical view illustrates a waterproof and dustproof structure of the present invention. The waterproof and dustproof structure 31 can be made of a tin solder, a metal material, a plastic material or other waterproof and dustproof material, and closely attached to the first surface 321 of the circuit board 11, and covers up the predetermined hole 111, thereby achieving the goal of waterproof and dustproof. Simultaneously, to compare with the conventional exterior housing 13, the problem of waterproof and dustproof can be efficiently overcome through the present invention after inserting the connector 13.

Although the features and advantages of the embodiments according to the preferred invention are disclosed, it is not limited to the embodiments described above, but encompasses any and all modifications and changes within the spirit and scope of the following claims.

What is claimed is:

1. A waterproof and dustproof structure for sealing a predetermined hole of a circuit board, the predetermined hole allowing a connection end of a connector to pass there through, the circuit board having a first surface and a second surface, the waterproof and dustproof structure comprising:
    a concave surface defining an accommodating space for accommodating the connection end of the connector while the connection end is disposed to pass through the predetermined hole from the second surface to the first surface;
    whereby the waterproof and dust proof structure is applicable to be disposed on the first surface of the circuit board for covering up only the predetermined hole and a peripheral area surrounding the predetermined hole to isolate the first surface and the second surface of the circuit board.

2. The waterproof and dustproof structure of claim 1, wherein the circuit board is a motherboard.

3. The waterproof and dustproof structure of claim 1, wherein the connector is a male connector.

4. The waterproof and dustproof structure of claim 3, wherein the circuit board has a female connector for connecting the male connector.

5. The waterproof and dustproof structure of claim 1, wherein the waterproof and dustproof structure is made of a metal material.

6. The waterproof and dustproof structure of claim 5, wherein the metal material is a tin solder.

7. The waterproof and dustproof structure of claim 1, wherein the waterproof and dustproof structure is made of a plastic material.

8. A waterproof and dustproof connector assembly applicable for sealing a predetermined hole of a circuit board having a first surface and a second surface, the waterproof and dustproof connector assembly comprising:
    a female connector with a through hole, the female connector being disposed on the second surface of the circuit board with the through hole corresponding to the predetermined hole;
    a male connector with a protrusion portion defining a connection end, the connection end being inserted to pass through the through hole and the predetermined hole to be connected and fastened to the female connector; and
    a sealing structure being disposed on the first surface of the circuit board for sealing the predetermined hole by covering up only the predetermined hole and a peripheral area surrounding the predetermined hole to isolate the first surface and the second surface of the circuit board, the sealing structure having a concave surface defining an accommodating space for accommodating the connection end of the connector while the connection end is disposed to pass through the predetermined hole from the second surface to the first surface.

9. The waterproof and dustproof connector assembly of claim 8, further comprising a waterproof rubber disposed between the female connector and the male connector.

10. The waterproof and dustproof connector assembly of claim 9, wherein the waterproof and dustproof structure is made of a metal material.

11. The waterproof and dustproof connector assembly of claim 10, wherein the metal material is a tin solder.

12. The waterproof and dustproof connector assembly of claim 9, wherein the waterproof and dustproof structure is made of a plastic material.

* * * * *